United States Patent
Licausi et al.

(10) Patent No.: US 10,475,692 B2
(45) Date of Patent: Nov. 12, 2019

(54) SELF ALIGNED BURIED POWER RAIL

(71) Applicant: GLOBALFOUNDRIES INC., Grand Cayman (KY)

(72) Inventors: Nicholas V. Licausi, Watervliet, NY (US); Guillaume Bouche, Brussels (BE); Lars W. Liebmann, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 194 days.

(21) Appl. No.: 15/481,826

(22) Filed: Apr. 7, 2017

(65) Prior Publication Data
US 2018/0294267 A1 Oct. 11, 2018

(51) Int. Cl.
| H01L 21/74 | (2006.01) |
| H01L 27/108 | (2006.01) |
| H01L 27/088 | (2006.01) |
| H01L 27/092 | (2006.01) |
| H01L 23/528 | (2006.01) |
| H01L 23/535 | (2006.01) |

(52) U.S. Cl.
CPC ........ *H01L 21/743* (2013.01); *H01L 23/5286* (2013.01); *H01L 23/535* (2013.01); *H01L 27/0886* (2013.01); *H01L 27/0924* (2013.01); *H01L 27/10879* (2013.01)

(58) Field of Classification Search
CPC .............. H01L 21/743; H01L 27/0886; H01L 27/0924; H01L 27/10879
USPC ........................................................ 438/262
See application file for complete search history.

(56) References Cited

U.S. PATENT DOCUMENTS

| 6,492,244 | B1 | 12/2002 | Christensen et al. | |
| 6,498,057 | B1 | 12/2002 | Christensen et al. | |
| 6,667,518 | B2 | 12/2003 | Christensen et al. | |
| 9,123,656 | B1* | 9/2015 | Hsieh | H01L 21/3086 |
| 2007/0152342 | A1* | 7/2007 | Tsao | H01L 21/76805 |
| | | | | 257/774 |
| 2008/0164573 | A1* | 7/2008 | Basker | H01L 21/486 |
| | | | | 257/621 |
| 2009/0072400 | A1* | 3/2009 | Zhu | H01L 21/76816 |
| | | | | 257/751 |
| 2011/0062502 | A1* | 3/2011 | Yin | H01L 21/76816 |
| | | | | 257/288 |
| 2013/0122686 | A1* | 5/2013 | Chang | H01L 21/02639 |
| | | | | 438/429 |

(Continued)

OTHER PUBLICATIONS

Specification and Drawings for U.S. Appl. No. 15/141,087, filed Apr. 28, 2016, 50 pages.

*Primary Examiner* — Duy T Nguyen
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to self-aligned buried power rail structures and methods of manufacture. The method includes: forming at least one fin structure of a first dimension in a substrate; forming at least one fin structure of a second dimension in the substrate; removing at least a portion of the at least one fin structure of the second dimension to form a trench; filling the trench with conductive metal to form a buried power rail structure within the trench; and forming a contact to the buried power rail structure.

18 Claims, 10 Drawing Sheets

(56) References Cited

U.S. PATENT DOCUMENTS

2013/0270711 A1\* 10/2013 Hebding ............... H01L 21/768
                                                                                                    257/774

\* cited by examiner

SELF ALIGNED BURIED POWER RAIL

FIELD OF THE INVENTION

The present disclosure relates to semiconductor structures and, more particularly, to self-aligned buried power rail structures and methods of manufacture.

BACKGROUND

Fabricating smaller, more densely packed devices having greater computing capability is a continuing objective in building semiconductor devices. In designing semiconductor devices, each cell of the device requires power input (Vdd) and ground (Vss) connections. To power the various components, each cell is also coupled to a power rail which is electrically connected to an active layer of the cell to provide the input power (Vdd). In some instances, a plurality of power rails may be provided for each cell to respectively provide the input power (Vdd) and the ground (Vss).

To improve area scaling as pitch scaling slows, track count of the standard cell libraries can be reduced, and architecture reset. However, track reduction beyond 6T (6 tracks) is difficult due to a lack of signal tracks available for automated routing. Also, due to lithographic overlay tolerances, it becomes difficult to consider to bury the power rail in smaller technology nodes so as to reduce track count, without shorting of the devices.

SUMMARY

In an aspect of the disclosure, a method comprises: forming at least one fin structure of a first dimension in a substrate; forming at least one fin structure of a second dimension in the substrate; removing at least a portion of the at least one fin structure of the second dimension to form a trench; filling the trench with conductive metal to form a buried power rail structure within the trench; and forming a contact to the buried power rail structure.

In an aspect of the disclosure, a method comprises: forming a first spacer of a first dimension over a substrate material; forming a second spacer of a second dimension, wider than the first dimension and above the first spacer; transferring the second dimension of the second spacer into the substrate to form a wide fin structure; transferring the first dimension of the first spacer into the substrate to form a narrow fin structure, narrower than the wide fin structure; removing at least part of the wide fin structure to form a trench, which is isolated from the narrow fin structure; forming a buried power rail by filling the trench with conductive material; and forming a contact to the buried power rail.

In an aspect of the disclosure, a structure comprises: a partial fin structure of substrate material; a buried power rail comprising conductive metal fill material aligned with and over the partial fin structure; and a contact to the buried power rail.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to self-aligned buried power rail structures and methods of manufacture. In embodiments, the structures can be self-aligned to neighboring fins, increasing process window margin and reducing power rail variability. Advantageously, the self-aligned buried power rail structures and fabrication processes described herein can provide tighter power rail width control, resulting in track reduction beyond 6T (e.g., 5T or smaller) while still reducing resistance and capacitance variability in scaled devices at various technology nodes.

In embodiments, the self-aligned buried power rail structures can be fabricated using, e.g., self-aligned quadruple patterning (SAQP), self-aligned double patterning (SADP), or dual SADP fabrication processes. By using these processes, the self-aligned buried power rail structures can be formed using wide and narrow fin structures, with the wide fin structures later removed by a, e.g., Si recess/etch back process, to form self-aligned buried power rails. The power rail pre-gate module can be inserted using high-melting point metals, e.g., Ru or W.

The self-aligned buried power rail structures of the present disclosure can be manufactured in a number of ways using a number of different tools. In general, though, the methodologies and tools are used to form structures with dimensions in the micrometer and nanometer scale. The methodologies, i.e., technologies, employed to manufacture the self-aligned buried power rail structures of the present disclosure have been adopted from integrated circuit (IC) technology. For example, the structures are built on wafers and are realized in films of material patterned by photolithographic processes on the top of a wafer. In particular, the fabrication of the self-aligned buried power rail structures uses three basic building blocks: (i) deposition of thin films of material on a substrate, (ii) applying a patterned mask on top of the films by photolithographic imaging, and (iii) etching the films selectively to the mask. The processes can also include a polishing of the materials, e.g., metallization using a chemical mechanical planarization (CMP).

Figure 1:
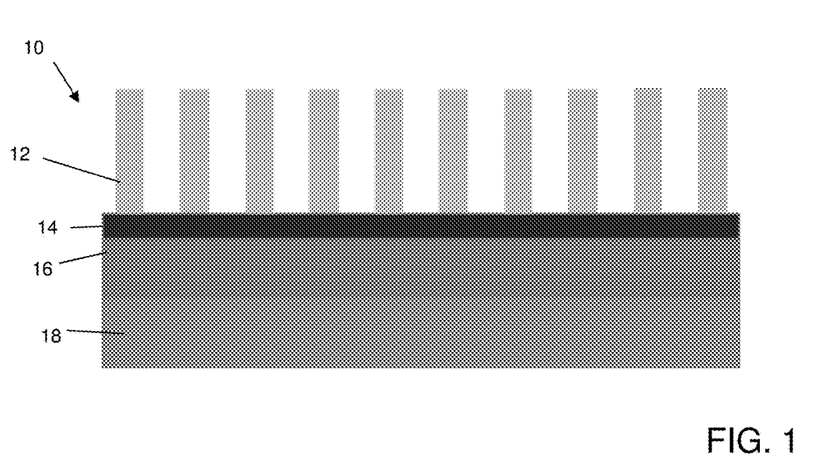
FIG. 1 shows a structure and respective fabrication processes in accordance with aspects of the present disclosure.

FIG. 1 shows a structure and respective fabrication processes in accordance with aspects of the present disclosure. In FIG. 1, the structure 10 includes a plurality of spacers 12 formed over one or more hardmask materials 14, 16 to create an evenly spaced line grating. Note that an irregular grating obtained with other patterning technique is also considered. In embodiments, the plurality of spacers 12 can be composed of any conformal spacer material, e.g., $SiO_2$, TiN, $TiO_2$, etc., deposited by a conformal deposition process, e.g., chemical vapor deposition (CVD), followed by a conventional patterning process. In embodiments, the plurality of spacers 12 can have a pitch of about 24 nm; although other pitches and dimensions are contemplated herein depending on the technology node of the structure.

Still referring to FIG. 1, the hardmask materials 14, 16 can be different materials, e.g., silicon oxide and silicon nitride based materials, referring hereafter simply as oxide and nitride. In preferred embodiments, the hardmask material 14 is oxide; whereas, the hardmask material 16 is nitride.

The hardmask materials 14, 16 can be deposited on a substrate 18 using conventional deposition processes, e.g., CVD. In embodiments, the substrate 18 can be Si material; although other semiconductor materials are also contemplated herein. For example, the substrate material can be composed of any suitable material including, but not limited to, SiGe, SiGeC, SiC, GaAs, InAs, InP, and other III/V or II/VI compound semiconductors. In latter processing steps, the substrate 18 will be patterned to fabricate semiconductor device with their active part in the shape of fins.

Figure 2:
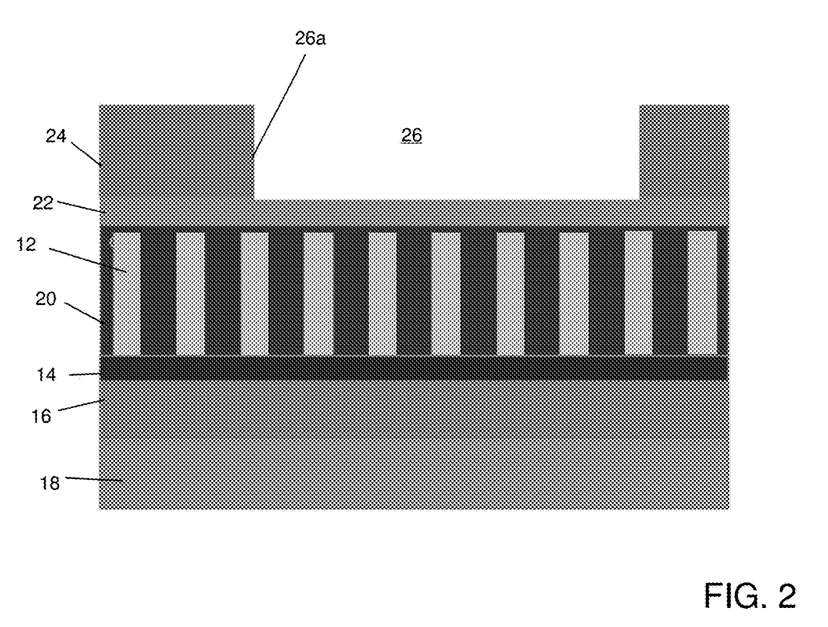
FIG. 2 shows an opening in a mandrel, amongst other features, and respective fabrication processes in accordance with aspects of the present disclosure.

Referring to FIG. 2, a self-planarizing material 20 is deposited on the plurality of spacers 12. In embodiments, the self-planarizing material 20 can be, e.g., amorphous carbon, Spin-On Hardmask (SOH), Organic Deposition Layer (ODL) or Organic Planarization Layer (OPL) materials; although, other materials are also contemplated herein. In case that non-self-planarizing materials are utilized, e.g., silicon oxide material, a chemical mechanical polishing (CMP) can be performed after deposition of the material. A hardmask material 22, e.g., SiON, is deposited on the material 20. In embodiments, the hardmask material 22 can be deposited using conventional deposition processes, e.g., CVD or PVD. A mandrel material 24 is deposited on the hardmask material 22. The mandrel material 24 can be, e.g., amorphous silicon, or other material selective to the hardmask materials.

Still referring to FIG. 2, a trench 26 is formed in the mandrel material 22 using conventional lithography and etching processes. For example, a resist (not shown) formed over the mandrel material 24 is exposed to energy (light) to form a pattern (opening). An etching process with a selective chemistry, e.g., reactive ion etching (RIE), is used to form one or more trenches 26 in the mandrel material 24 through the openings of the resist. The resist can then be removed by a conventional oxygen ashing process or other known stripants. In embodiments, edges or sides 26a of the trench 26 overlap selected spacers 12.

Figure 3:
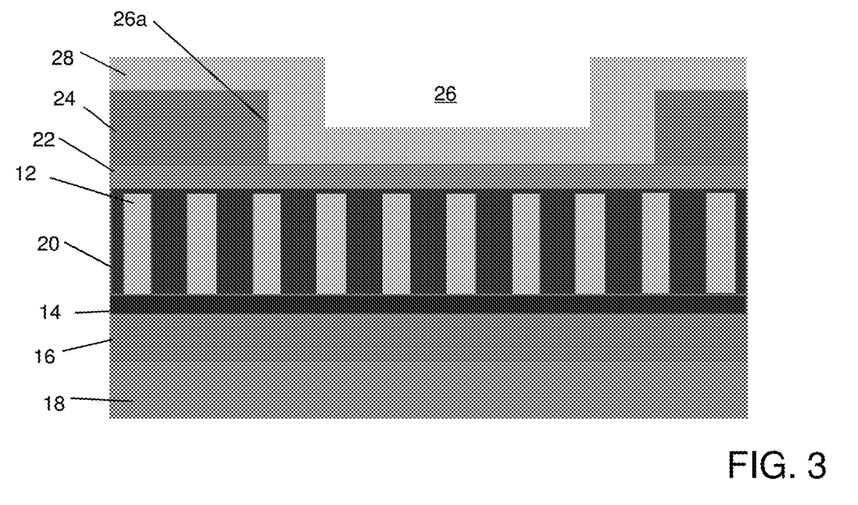
FIG. 3 shows a sidewall material on the mandrel and in a trench of the mandrel, amongst other features, and respective fabrication processes in accordance with aspects of the present disclosure.

As representatively shown in FIG. 3, spacer material 28 is formed on the mandrel material 24 and within the trench 26. In embodiments, the spacer material 28 is formed by conformally depositing a spacer material, e.g., oxide, on the mandrel material 24 and within the trench 26. In embodiments, the deposition process can be an atomic layer deposition (ALD) process which, as should be understood by those of skill in the art, is a highly conformal deposition process that provides exceptional coverage on sidewalls 26a of the trench 26.

Figure 4:
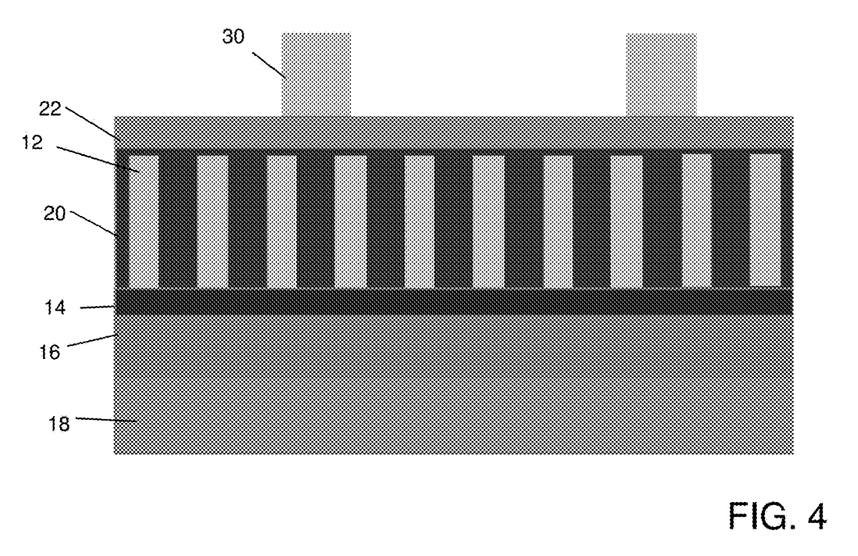
FIG. 4 shows spacer formation offset from underlying spacers, amongst other features, and respective fabrication processes in accordance with aspects of the present disclosure.

In FIG. 4, upper spacers 30 are formed from the spacer material, in alignment with the underlying spacers 12, e.g., slightly overlapping edges of adjacent spacers 12. In embodiments, the upper spacers 30 are wider than the spacers 12 in order to allow formation of wider and narrower fin structures in subsequent processing steps.

More specifically, the upper spacers 30 can be formed by an etch back process and subsequent removal of the mandrel material 24. In embodiments, the etch back process is an anisotropic etching process which will remove the spacer material from a horizontal surface of the mandrel material 24 and within the trench 26. This process will leave the spacer material 28 on sidewalls 26a of the trench 26. Following this anisotropic etching process, the exposed mandrel material 24 can be removed by a selective etching process, e.g., RIE, with a selective chemistry to remove the mandrel material 24, thereby forming the upper spacers 30. Advantageously, these processes can be performed without any additional masks.

Figure 5:
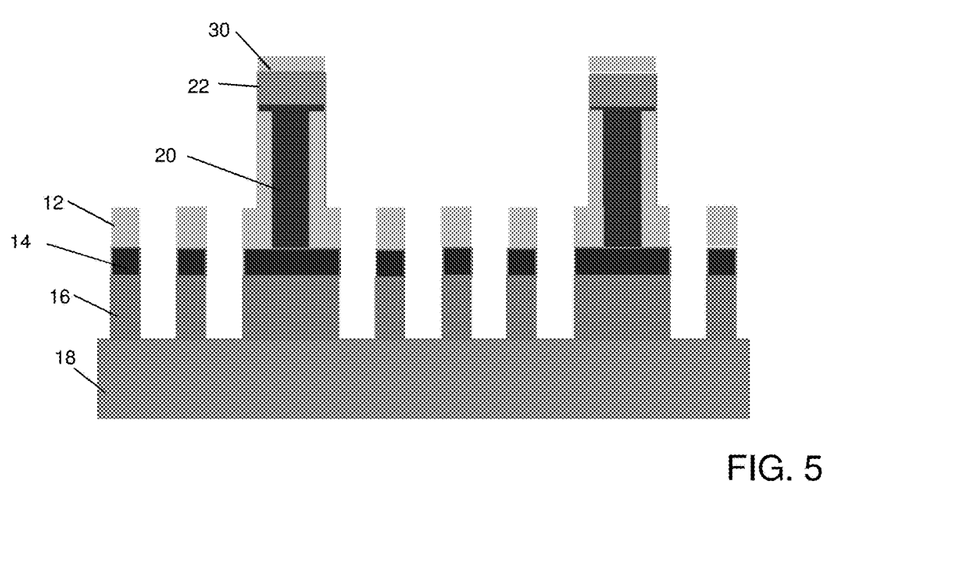
FIG. 5 shows spacers for transferring dimensions to underlying material, amongst other features, and respective fabrication processes in accordance with aspects of the present disclosure.

In FIG. 5, the dimensions of the upper spacers 30 and the spacers 12 are transferred to the underlying materials 14, 16 20, 22 to form wide and narrow structures, respectively. For example, in these transfer processes, the upper spacers 30 and the spacers 12 will act as a mask for protecting underlying materials. By way of more specific example, the dimensions of the spacer 30 are first transferred into the materials 20, 22 by a conventional etching process (with the spacer 30 acting as a mask), followed by the dimensions of both spacers 12 and 30 being transferred into the materials 14, 16 (with the spacers 12, 30 acting as masks). In this way, material that is not protected by the spacers 12 or spacers 30 can be removed by selective etching processes, with the remaining material forming equally spaced narrow and wide structures, e.g., narrow structures 32 and wide structures 34.

FIG. 5 illustrates that the second spacer 30 essentially acts as a block layer to merge together the area comprising two adjacent spacers 12 and the space between those two spacers 12. It should be understood by those of skill in the art that the same technique could be used to merge together any number "n" of spacers 12 and number (n−1) of spaces between those spacers 12. It is also understood that if an inner spacer technique is used to create large block shape 30, with the benefit of having a good control of its width, it is possible to directly use a lithographic technique to pattern shapes 30. In any case, the edges of shape 30 lay at the top of the spacers 12 to merge together, so lithographic edge placement error is of concern. Typically, the width of the spacer 12 should be larger than twice the minimum overlay achievable with process of record lithographic technique, e.g., currently a 4 nm overlay minimum.

Figure 6:
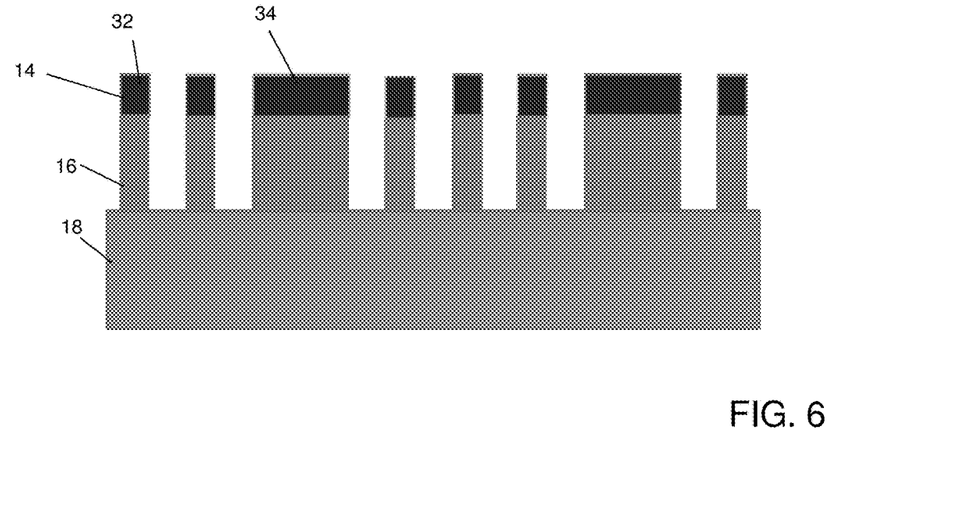
FIG. 6 shows narrow structures and wide structures, amongst other features, and respective fabrication processes in accordance with aspects of the present disclosure.

In FIG. 6, any residual material which formed the spacers 12, 30 and materials 20, 22 can be removed by a selective etching process. This removal process will result in equally or substantially narrow structures 32 and wide structures 34 composed of hardmask materials 14 and 16. In embodiments, the thickness of the spacers 30 can be tuned to create different dimensioned buried power rails; whereas, the thickness of the spacer 12 can be tuned to target an intended final fin critical dimension (CD). Furthermore, the space between the edges of structure 34 and an adjacent structure 32 are controlled by the original SADP process or SAQP process. This self-aligned process enables high control of this space which significantly greater position than the overlay margin associated with traditional lithographic processes. Accordingly, the power rail will never be closer to a neighboring fin than two neighboring fins.

Figure 7:
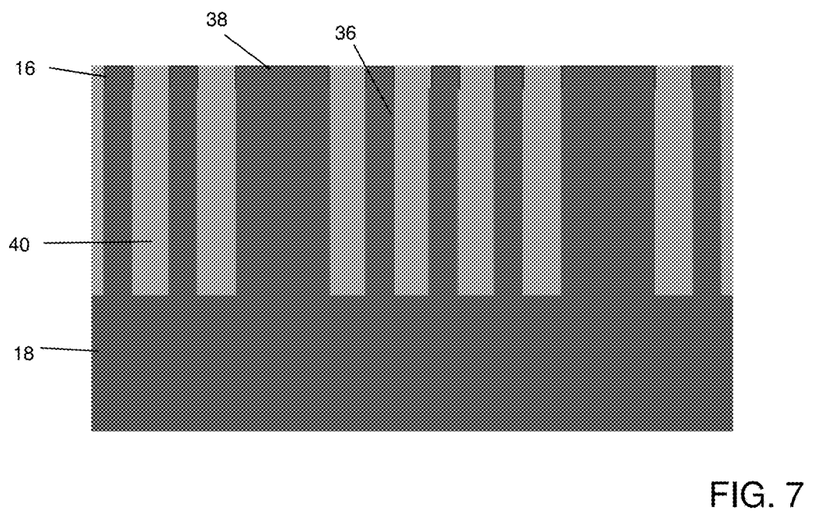
FIG. 7 shows narrow fin structures and wide fin structures, amongst other features, and respective fabrication processes in accordance with aspects of the present disclosure.

In FIG. 7, the dimensions of the narrow structures 32 and wide structures 34 are transferred into the underlying substrate 18 using conventional fin etch processes. After the transfer process, hardmask material 14 can be removed by an etching process. In this way, narrow fin structures 36 and wide fin structures 38 can be formed in the substrate 18, with hardmask material 16 remaining on the surfaces thereof. As described herein, the wide fin structures 38 can be removed to form a buried power rail; whereas, the narrow fin structures 36 will be used for device. Accordingly, the thickness of the spacers 30 can be used to tune the width of the power rail, and the thickness of the spacer 12 can be tuned to target an intended final fin critical dimension (CD). The gap between the power rail and an adjacent fin is equal to the gap between two small adjacent fins.

Following the fin formation, a gap fill material 40 is deposited within the spaces between the narrow fin structures 36 and wide fin structures 38. In embodiments, the gap fill material 40 can be an oxide deposition process, e.g., CVD. Any residual material deposited on the surface of the material may be removed by a CMP process, stopping on the hardmask material 16.

Figure 8:
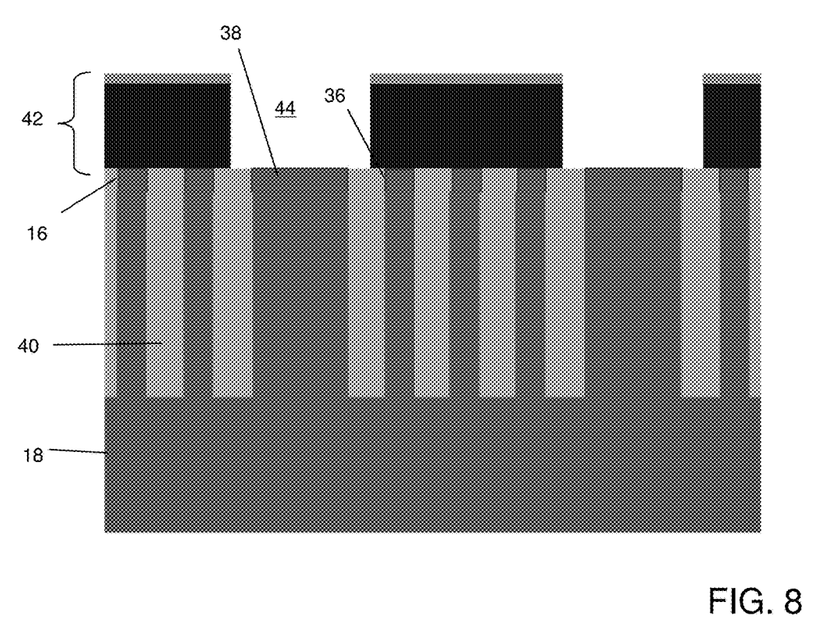
FIG. 8 shows an opening in a hardmask material to expose the wide fin structures, amongst other features, and respective fabrication processes in accordance with aspects of the present disclosure.

FIG. 8 shows additional structures and respective fabrication processes for forming the buried power rail. Specifically, a stack of hardmask material 42 is deposited on the structure of FIG. 7, e.g., gap fill material 40 and fin structures 36, 38, followed by a resist (not shown) formed over the stack of material 42. After exposing the resist to energy (light) to form a pattern (opening), an etching process with a selective chemistry, e.g., reactive ion etching (RIE), will be used to form one or more openings 44 in the stack of material 42. In embodiments, the one or more openings 44 will align with and expose the wide fin structures 40. The resist can then be removed by a conventional oxygen ashing process or other known stripants.

Figure 9:
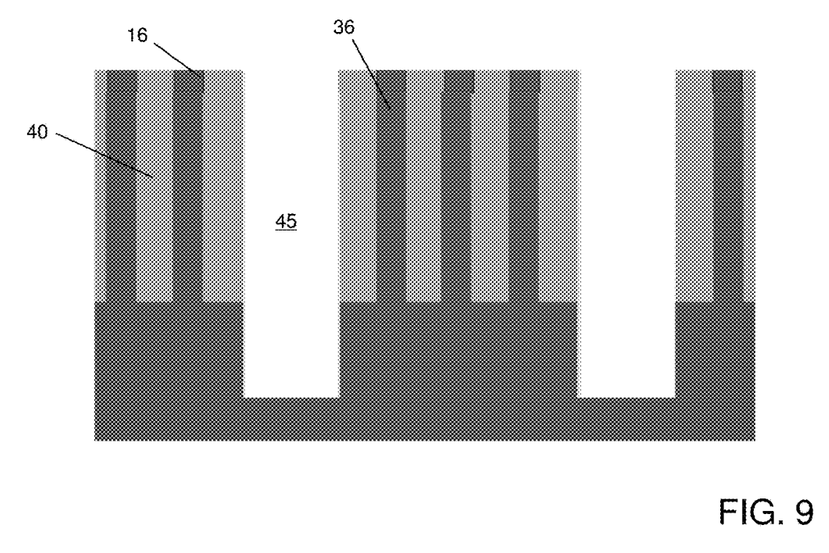
FIG. 9 shows trenches formed from removal of the wide fin structures, amongst other features, and respective fabrication processes in accordance with aspects of the present disclosure.

In FIG. 9, trenches 45 are formed by removal of the exposed wide fin structures 40 through the openings in the stack of material. In embodiments, the trenches 45 can be formed by conventional etching (RIE) processes, which selectively remove the material of the wide fin structures 40 and exposed hardmask material. A combination of RIE and chemical wet etch can also be used. Any remaining materials of the lithography stack can then be removed by conventional etching processes. The depth of the trenches 44 can be tuned as needed for the power rail size by timing of the etching process. For example, the depth of the trench 44 can be about 50 nm to about 200 nm. As described herein, buried power rails can be formed within the trenches 44.

Figure 10:
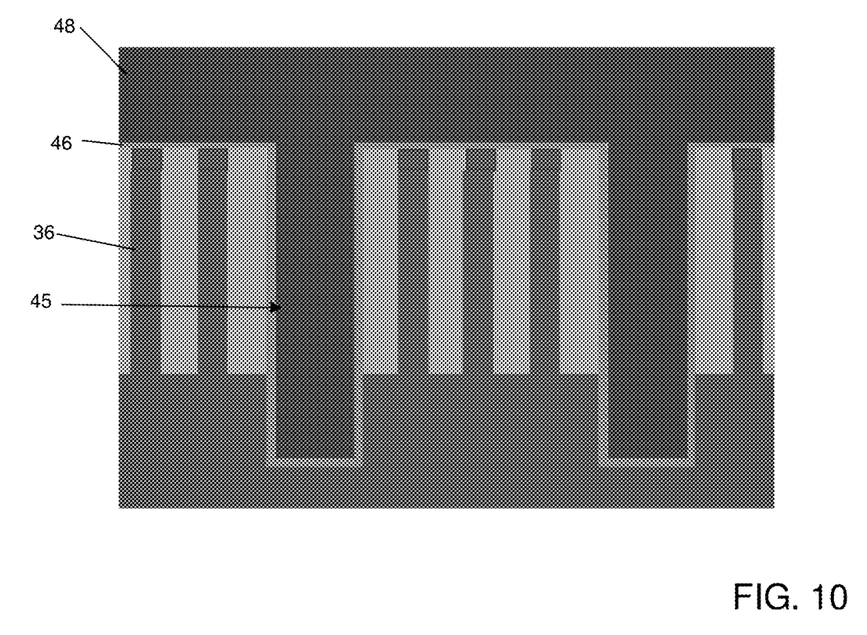
FIG. 10 shows metal fill in the trench, amongst other features, and respective fabrication processes in accordance with aspects of the present disclosure.

In FIG. 10, a liner 46 is deposited on surfaces of the trenches 45 and over remaining exposed surfaces of the gap fill material 40 and the narrow fin structures 36. In embodiments, the liner 46 can be a multi-layer liner, combining a first dielectric film to isolate electrically the substrate at the bottom of the trench, for instance an oxide or a nitride, then a single or bi-layer of barrier material, e.g., TaN, TiN, Co, Ru, etc. The stack of liner 46 can be deposited to a thickness of about 0.5 nm to about 6 nm; although other dimensions are also contemplated by the present disclosure. A metal fill material 48 is deposited over the liner 46, within the trenches 45. The metal fill material 48 is used to fabricate the buried power rail, which can be a high melting temperature metal, e.g., Ru, W, Co, Mo, to enable high thermal budget flow. The metal fill material 48 and liner 46 can be planarized using, e.g., CMP processes, stopping on the gap fill material 40 and the hardmask material 16 on the narrow fin structures 36.

Figure 11:
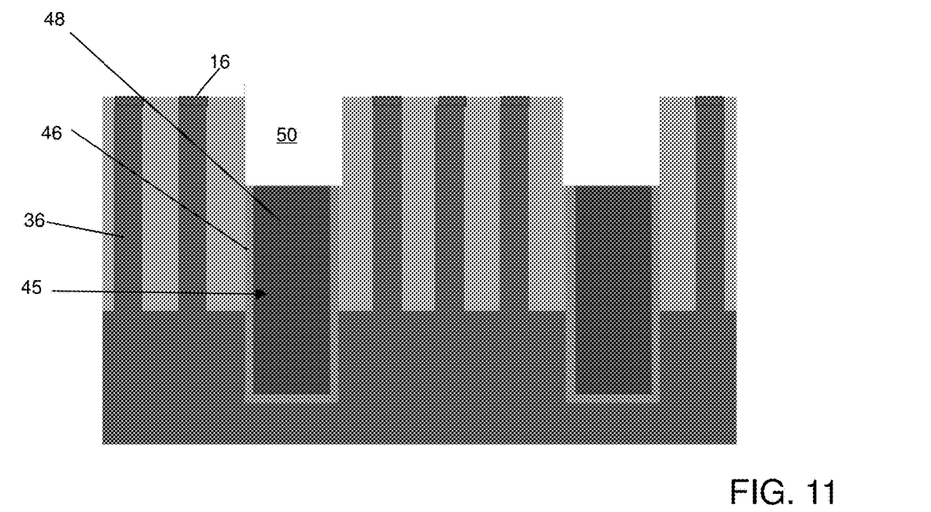
FIG. 11 shows a recess of the metal fill in the trench, amongst other features, and respective fabrication processes in accordance with aspects of the present disclosure.

As shown in FIG. 11, the metal fill material 48 and liner 46 are recessed by a wet chemical or dry etching process, as an example, to form the buried power rail. For example, the wet etch process can use chemistries to remove Ru, W, Co, Mo, etc., and barrier materials, e.g., TiN, etc. The recess 50 formed by this process can be a depth of about 65 nm; although other dimensions which allow a gate to wrap around the narrow fin structures 36 are also contemplated herein.

Figure 12:
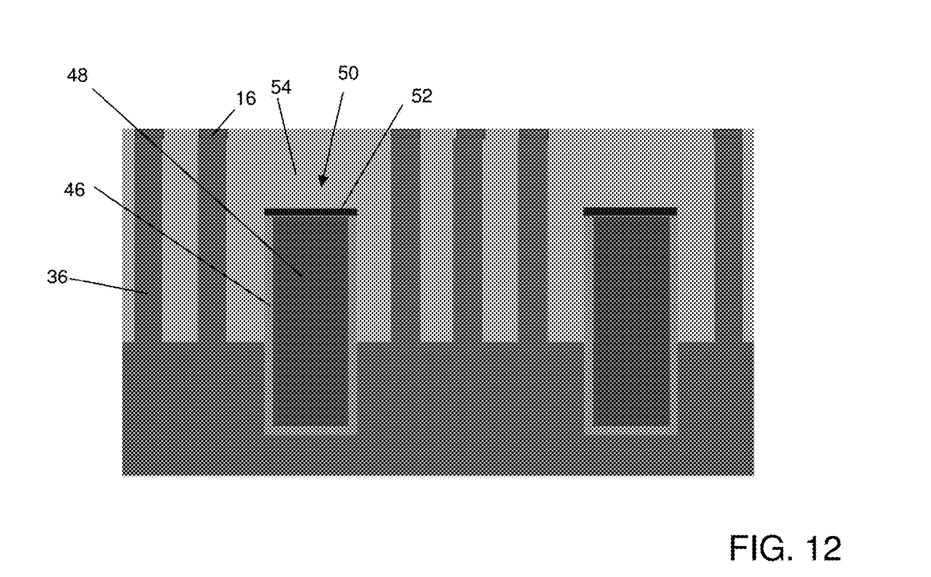
FIG. 12 shows power rail structures with a capping material, amongst other features, and respective fabrication processes in accordance with aspects of the present disclosure.

In FIG. 12, a capping material 52 is formed on the exposed surfaces of the metal fill material 48 and liner 46, within the recess 50. In embodiments, the capping material 52 is any barrier material that will prevent electro-migration issues, e.g., Co or Ru, associated with the buried power rail. In embodiments, the capping material 52 is deposited by a conventional selective CVD growth process, which results in the capping material 52 growing only on the underlying metal layers, e.g., exposed surfaces of the metal fill material 48 and liner 46. The capping material 52 can have a thickness of about 1 nm to about 4 nm; although other dimensions are contemplated by the present disclosure depending on the technology node and design characteristics of the device. It may be considered to omit this capping material depending on the metal fill material 48 chosen.

Following the deposition of the capping material 52, a gap fill material 54 is deposited within the remaining space of the recess 50. In embodiments, the gap fill material 54 can be an oxide deposition process, e.g., CVD. Any residual material deposited on the surface of the narrow fin structures 36 and gap fill material 40 may be removed by a CMP process, stopping on the hardmask material 16.

Figure 13:
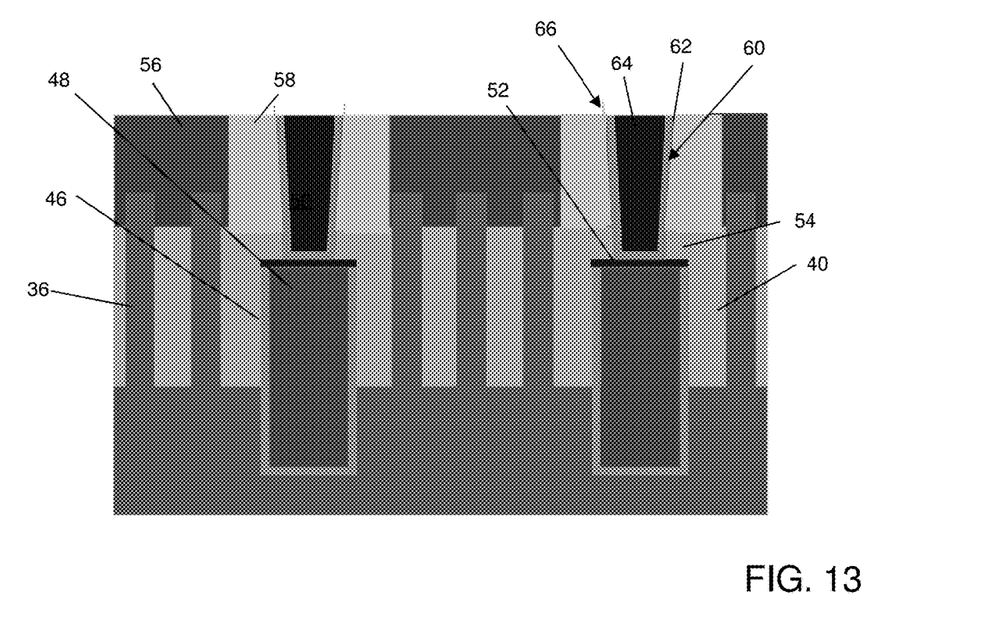
FIG. 13 shows contacts formed to the power rail structures, amongst other features, and respective fabrication processes in accordance with aspects of the present disclosure.

FIG. 13 shows contact and gate formation, amongst other structures, in accordance with aspects of the present disclosure. In embodiments, contacts 66, connecting to the power rail, can be formed by recessing the gap fill materials 40, 54 and removing the hardmask material on the narrow fin structures 36. In this way, upper portions of the narrow fin structures 36 are exposed for subsequent gate formation. In embodiments, approximately 15 nm to 75 nm of the gap fill material 54 will remain over the capping material 52 after the recessing processes.

Still referring to FIG. 13, gate material 56 is formed (wrapped) over the exposed narrow fin structures 36, separated by insulator material 58. The gate material 56 can be any combination of materials that can form a gate structure, e.g., high-k dielectric material, workfunction metals, gate metals, polysilicon, etc., and the insulator material 58 can be any insulating material, e.g., oxide based materials. The gate material 56 and the insulator material 58 can be formed by any appropriate deposition processes, e.g., CVD, PECVD, PVD, ALD etc.

FIG. 13 further shows an opening 60 formed in the insulator material 58 and underlying gap fill material 54, aligned with and exposing the capping material 52. A liner material 62 is deposited on the sidewalls of the opening 60, in contact with the capping material 52 (e.g., electrically connected to the power rail). The liner material 62 can be Ta, TiN, TaN, Ru or Co, amongst other conductive materials. A metal fill material 64 is then deposited over the liner material 62. The metal fill material 64 can be, e.g., Co, Cu, Ru or W. In embodiments, the liner material 62 and metal fill material 64 can be deposited using conventional deposition processes as described herein to form the contact to the buried power rail. Any residual material can then be removed using conventional CMP processes.

Still referring to FIG. 13, it can be observed that the space separating the power rail to an adjacent fin, and isolating the two from one another, is resulting from the original grating displayed in FIG. 1. The final structure therefore benefits from the fact that the power rail is self-aligned by process. In this way, the isolation gap around the power rail is at no risk of being reduced beyond the minimum critical distance needed to prevent the power rail to interact with adjacent fin. From the angle of fabrication, there is also no risk this way of having metal atoms (from the power rail processing) diffusing into the active substrate, an essential device reliability concern and tool contamination concern.

FIGS. 14-17 show structures and respective fabrication processes in accordance with additional aspects of the present disclosure. More specifically, FIGS. 14-17 show structures and respective fabrication processes for fabricating of a self-aligned buried power rail structure during middle of the line processes.

Figure 14:
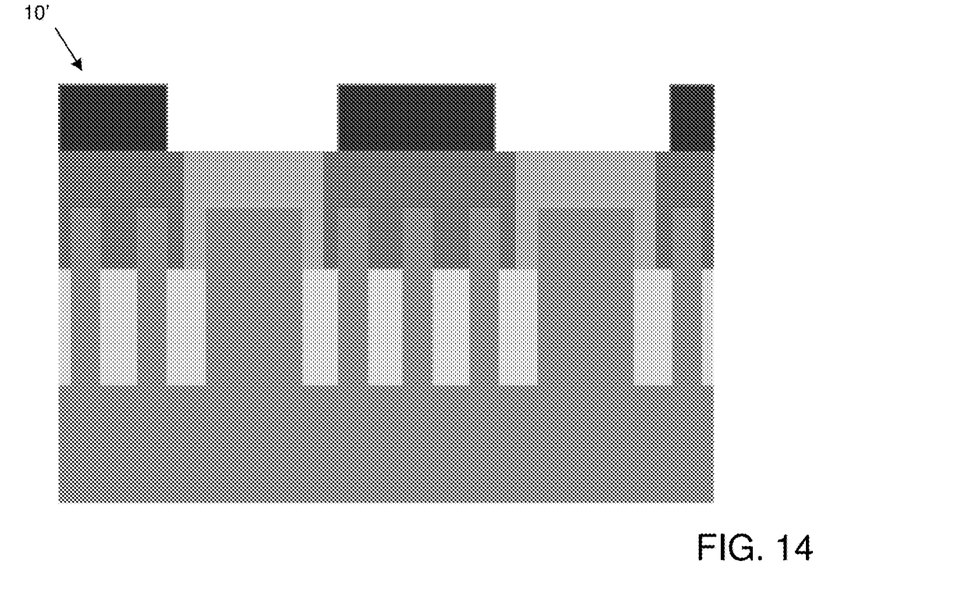
FIGS. 14-17 show structures and respective fabrication processes in accordance with additional aspects of the present disclosure.

For example, FIG. 14 shows a structure 10' comprising narrow fin structures 36 and wide fin structures 38 with recessed gap fill material 40 therebetween. In embodiments, the narrow fin structures 36 and wide fin structures 38 with recessed gap fill material 40 can be fabricated in the processes described herein. Gate material 56 is formed over (wrapped around) the exposed narrow fin structures 36. Insulator material 58 is formed over the wide fin structures 38, in the processes similar to that described with respect to FIGS. 1-13. One or more hardmask materials 68 can be deposited and patterned, resulting in openings 70 formed over the wide fin structures 38. The one or more hardmask materials 68 can be deposited and patterned using conventional deposition, lithography and etching processes as already described herein.

Figure 15:
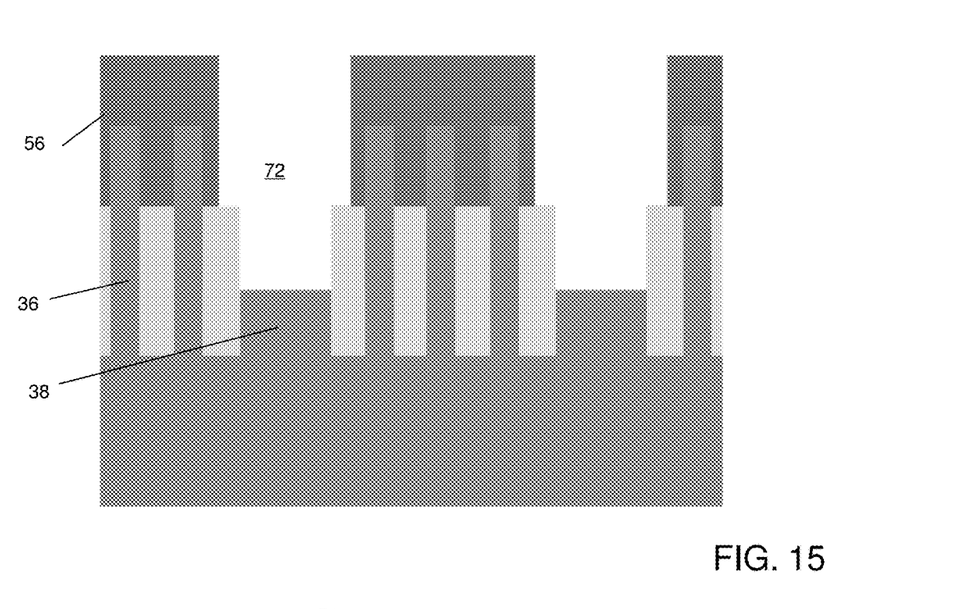

Referring to FIG. 15, trenches 72 are formed by removal of the insulator material 58 and portions of the exposed wide fin structures 40 through the openings in the hardmask material. In embodiments, the trenches 72 can be formed by conventional etching (RIE) processes, which selectively remove the material of the wide fin structures 40. Any remaining materials of the lithography stack can then be removed by conventional etching processes. The depth of the trenches 72 can be tuned as needed for the power rail size by timing of the etching process, which may depend on the desired aspect ratio desired, fill capability and target resistance for the power rail. For example, the depth of the trench 72 can be about 50 nm to about 200 nm. It should be noted that if a gate last (non-dummy gate) flow is utilized, the trench can be formed prior to the deposition of interlevel dielectric material (ILD).

Figure 16A:
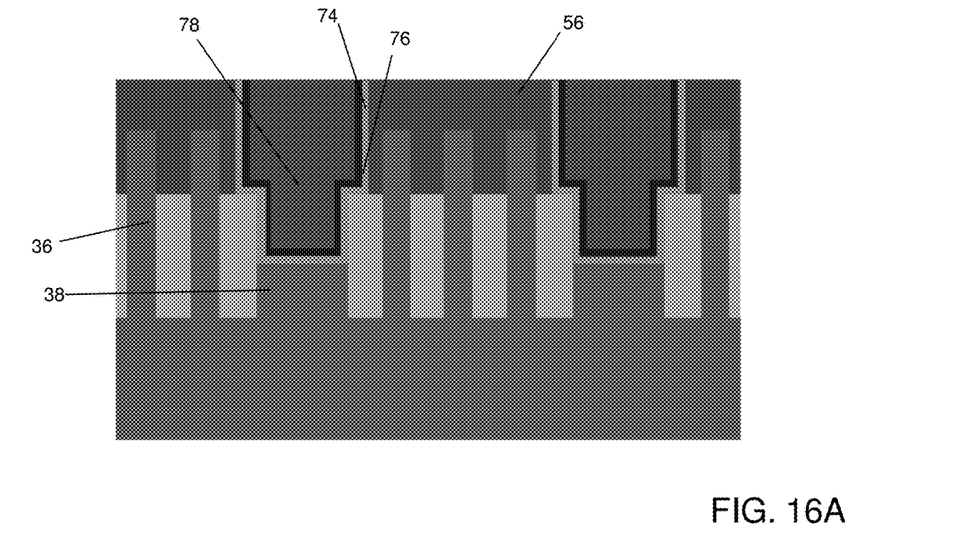

In FIG. 16A, a conformal, high quality dielectric material 74 is formed on the surfaces of the trench 72 to form an electric barrier between the buried power rail and gate structure. In embodiments, the high quality dielectric material 74 can be SiN material, as an example. A liner material 76, e.g., Ta, TiN, TaN, Ru or Co, etc., is deposited on the dielectric material 74, followed by a metal fill material 78 deposited over the liner material 76. The metal fill material 64 can be, e.g., Co, Cu, Ru, or W. In embodiments, the liner material 76 and metal fill material 78 can be deposited using conventional deposition processes as described herein. Any residual material can then be removed, e.g., polished back, using conventional CMP processes, stopping on the gate material 58.

Figure 16B:
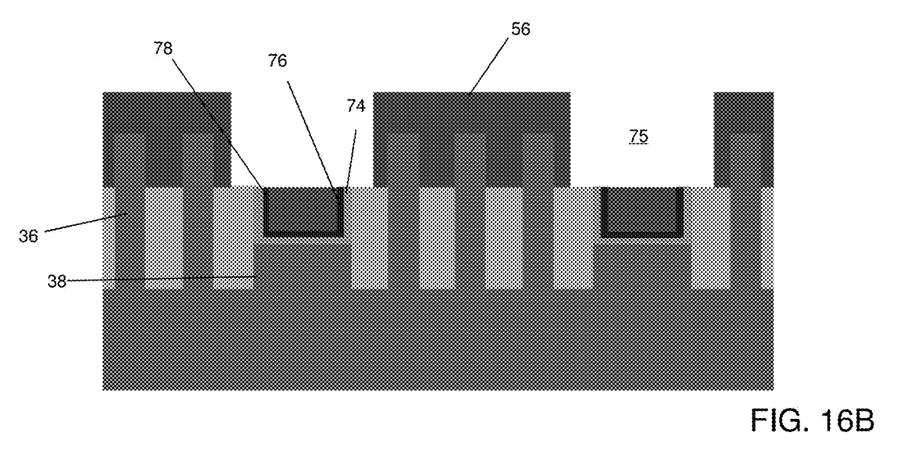

In FIG. 16B, the power rail can be recessed using a Cu/metal wet recess process as should be understood by those of skill in the art. This recess is shown at reference numeral 75.

Figure 17:
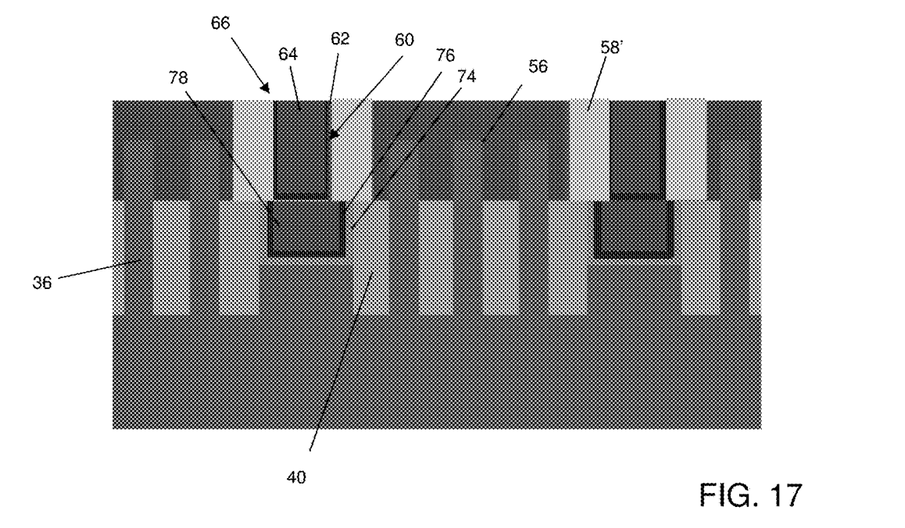

In FIG. 17, contacts 66 are formed in direct electrical contact with the underlying metal fill material, e.g., buried power rail. For example, insulator material 58' is deposited (refilled) between the gate material 56 using a conventional CVD process. The insulator material 58' is then planarized, e.g., using CMP processes, to expose the gate material 56. The insulator material 58' is also patterned, e.g., forming an opening 60 in the insulator material 58' aligned with and exposing the metal fill material 78. In this embodiment, the gate material 56 will act as a stopping layer for the CMP process.

A liner material 62 is deposited on the sidewalls of the opening 60, in contact with the metal fill material 78. The liner material 62 can be Ta, TiN, TaN, Ru or Co, amongst other materials. A metal fill material 64 is then deposited over the liner material 62. The metal fill material 64 can be, e.g., Co, Cu, Ru or W, amongst other materials. In embodiments, the liner material 62 and metal fill material 64 can be deposited using conventional deposition processes as described herein to form the contact to the buried power rail. Any residual material can then be removed using conventional CMP processes.

Figure 18:
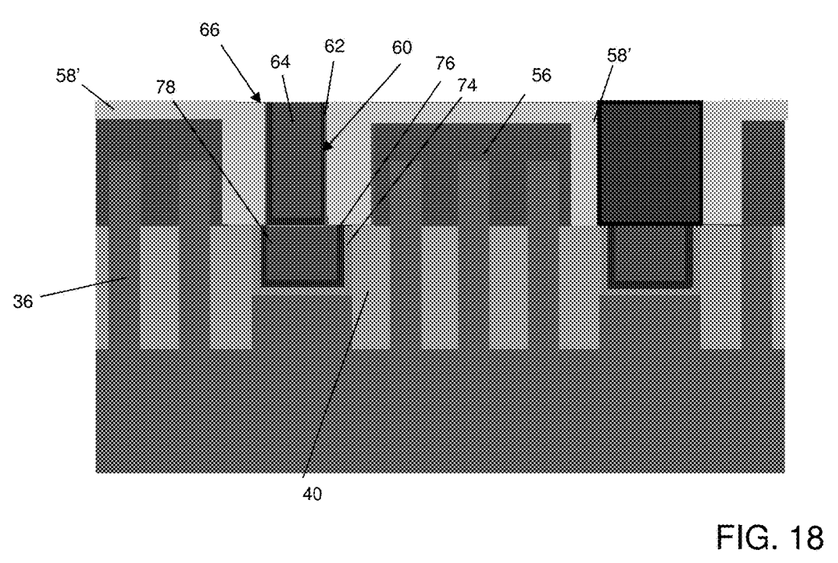
FIGS. 18 and 19 show structures and respective fabrication processes in accordance with additional aspects of the present disclosure.
Figure 19:
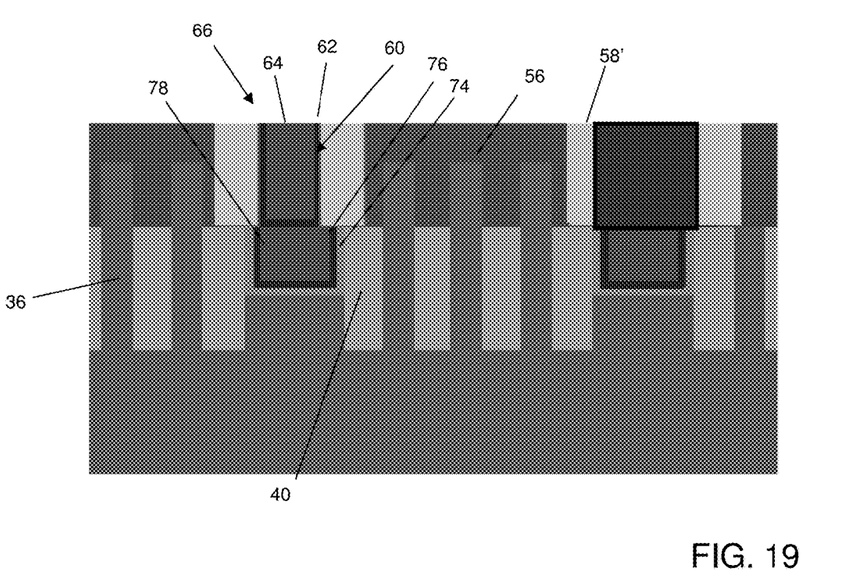

FIGS. 18 and 19 show structures and respective fabrication processes in accordance with additional aspects of the present disclosure. More specifically, FIGS. 18 and 19 show structures and respective fabrication processes for fabricating a self-aligned buried power rail structure during middle of the line processes using an electroless metal fill process. In this embodiment, as shown in FIG. 18, insulator material 58' is deposited (refilled) between the gate material 56 using a conventional CVD process. The insulator material 58' is then planarized, e.g., using a CMP process; however, in this planarization process, the gate material 56 is not exposed, e.g., the gate material remains covered with the insulator material 58'.

An opening 60 is formed in the insulator material 58' aligned with and exposing the metal fill material 78, which forms the buried power rail. A liner material 62 is deposited on the sidewalls of the opening 60, in contact with the metal fill material 78. The liner material 62 can be composed of Ta, TiN, TaN, Ru or Co, amongst other materials. A metal fill material 64 is then deposited using an electroless process over the liner material 62. The metal fill material 64 can be, e.g., Co, Cu, Ru or W, amongst other materials. In embodiments, the liner material 62 and metal fill material 64 can be deposited using conventional deposition processes as described herein.

In FIG. 19, any residual material of the liner material 62 and metal fill material 64 can be removed using conventional CMP processes, followed by an etch back of the insulator material 58', with the gate material 56 acting as an etch stop material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming at least one fin structure of a first dimension in a substrate;
    forming at least one fin structure of a second dimension in the substrate;
    removing at least a portion of the at least one fin structure of the second dimension to form a trench;
    filling the trench with conductive metal to form a buried power rail structure within the trench; and
    forming a contact to the buried power rail structure, wherein:
        the forming of the at least one fin structure of the first dimension comprises a first spacer transfer process which forms a first spacer that defines the at least one fin structure of the first dimension;
        the forming of the at least one fin structure of the second dimension comprises a second spacer transfer process which forms a second spacer that defines the at least one fin structure of the second dimension; and
        the second spacer is wider than the first spacer.

2. The method of claim 1, wherein the first dimension is narrower than the second dimension.

3. The method of claim 1, wherein the filling of the trench with the conductive metal includes lining the trench with a conductive barrier material and filling remaining portions of the trench with metal fill material, where the metal trench is self-aligned within the original fin grating.

4. The method of claim 3, further comprising recessing of the conductive barrier material and the metal fill material, and depositing a capping material over the recessed conductive barrier material and the metal fill material.

5. The method of claim 3, wherein the removing of the at least a portion of the at least one fin structure of the second dimension includes completely removing of the at least one fin structure of the second dimension.

6. The method of claim 3, wherein the removing of the at least a portion of the at least one fin structure of the second dimension includes partially removing of the at least one fin structure of the second dimension.

7. The method of claim 3, wherein the trench is lined with an insulator material under the conductive barrier material.

8. The method of claim 1, wherein:
    the second spacer is positioned above the first spacer.

9. The method of claim 8, wherein the second spacer overlaps with edges of the first spacer.

10. The method of claim 1, wherein the filling of the trench with the conductive metal is an electroless metal fill process, performed over a barrier liner material.

11. The method of claim 1, wherein the trench is isolated from the at least one fin structure of the first dimension by gap fill material.

12. A method comprising:
    forming a first spacer of a first dimension over a substrate material;
    forming a second spacer of a second dimension, wider than the first dimension and above the first spacer;
    transferring the first dimension of the first spacer into the substrate to form a narrow fin structure;
    transferring the second dimension of the second spacer into the substrate to form a wide fin structure, wherein the narrow fin structure is narrower than the wide fin structure;
    removing at least part of the wide fin structure to form a trench, which is isolated from the narrow fin structure;
    forming a buried power rail by filling the trench with conductive material; and
    forming a contact to the buried power rail.

13. The method of claim 12, further comprising removing the second spacer and the first spacer after forming of the wide fin structure and the narrow fin structure.

14. The method of claim 13, wherein the filling of the trench with the conductive material comprises:
    lining the trench with a conductive barrier material and filling remaining portions of the trench with metal fill material; and
    recessing of the conductive barrier material and the metal fill material.

15. The method of claim 14, further comprising depositing a capping material over the recessed conductive barrier material and the metal fill material.

16. The method of claim 12, wherein the removing at least part of the wide fin structure includes partially removing of the wide fin structure.

17. The method of claim 12, wherein the trench is lined with an insulator material under the conductive material.

18. The method of claim 12, wherein the filling of the trench with the conductive metal is an electroless metal fill process, performed over a barrier liner material.

* * * * *